United States Patent [19]
Yee et al.

[11] Patent Number: 6,093,936
[45] Date of Patent: *Jul. 25, 2000

[54] INTEGRATED CIRCUIT WITH ISOLATION OF FIELD OXIDATION BY NOBLE GAS IMPLANTATION

[75] Inventors: Abraham Yee, Cupertino; Sheldon Aronowitz, San Jose; Yu-Lam Ho, Cupertino, all of Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/918,577

[22] Filed: Aug. 19, 1997

Related U.S. Application Data

[60] Continuation of application No. 08/641,027, Apr. 29, 1996, abandoned, which is a division of application No. 08/479,104, Jun. 7, 1995, abandoned.

[51] Int. Cl.$^7$ .................................................. H01L 29/04
[52] U.S. Cl. ........................... 257/56; 257/52; 257/55; 257/57; 257/58
[58] Field of Search ................................ 257/52, 55, 56, 257/57, 58

[56] References Cited

U.S. PATENT DOCUMENTS

| | | | |
|---|---|---|---|
| 3,773,566 | 11/1973 | Tsuchimoto | 29/571 |
| 3,887,994 | 6/1975 | Ku et al. | 148/1.5 |
| 4,654,958 | 4/1987 | Baerg et al. | 29/571 |
| 4,689,667 | 8/1987 | Aronowitz | 357/63 |

OTHER PUBLICATIONS

"Epitaxial Regowth Of Ar–Implanted Amorphous Silicon," P. Revesz, M. Wittmer, J. Roth and W. Mayer; 1978 American Institute of Physics; J. Appl. Phys. 49(10), Oct. 1978, pp. 5199–5206.

"Interactions Between Interstitial Atoms In Silicon: Arsenic–Argon–Boron And Boron–Argon–Phosphorous," S. Argonowitz; 1988 American Institute of Physics; J. Appl. Phys. 63(4), Feb. 1988.

*Primary Examiner*—Jerome Jackson, Jr.
*Assistant Examiner*—George C. Eckert, II
*Attorney, Agent, or Firm*—Oppenheimer Wolff & Donnelly LLP

[57] ABSTRACT

A silicon semiconductor integrated circuit includes an insulative field oxidation layer which substantially does not encroach under active circuit elements of the integrated circuit. The field oxidation layer is formed of oxidized amorphous silicon created by bombardment of a silicon substrate with noble gas ions. The amorphous silicon oxidizes at a rate much faster than crystalline silicon so that when the field oxidation layer is formed crystalline silicon foundations for the active circuit elements are left substantially intact. The crystalline silicon foundations are formed by using appropriate shield elements during the noble gas ion bombardment. This noble gas ion bombardment also has the advantage of eliminating dislocation defects which may be present in the field oxidation area so that these defects do not propagate into the crystal lattice of the silicon during subsequent heating and cooling cycles. Also, the amorphous silicon relieves surface layer stresses which may be present from prior processes or because of prior morphological structural elements formed on the silicon substrate. A boron ion bombardment may also be used to further inhibit loss of P-well dopant to the oxidant forming the field oxidation layer and preserving a desired high field threshold voltage and robust field isolation for the integrated circuit.

5 Claims, 1 Drawing Sheet

INTEGRATED CIRCUIT WITH ISOLATION OF FIELD OXIDATION BY NOBLE GAS IMPLANTATION

This application is a continuation of application 08/641,027, filed Apr. 29, 1996, now abandoned which is a Divisional of Ser. No. 08/479,104 filed on Jun. 7, 1995 now abandoned.

BACKGROUND OF THE INVENTION

1. Field of the Invention

The present invention concerns the field of silicon-based integrated circuits and more particularly, integrated circuits having an insulative layer formed adjacent active circuit structures of the integrated circuit.

2. Related Technology

The implantation of noble gas and of other materials by ion implantation and other methods into the crystalline lattice of silicon has been studied for several years. For example, the following technical papers investigate various aspects of such implantation.

"Epitaxial Regrowth of Argon-implanted Amorphous Silicon", by P. Revesz, et al., Journal of Applied Physics, vol. 49, p. 5199 (1978). "Interactions Between Interstitial Atoms in Silicon: Arsenic-Argon-Boron and Boron-Argon-Phosphorous", by S. Aronowitz, Journal of Applied Physics, vol. 63, p. 1037 (1988).

While no pre-filing patentability search has been conducted with respect to the present invention, United States patents known to the Applicants and which may be relevant to the present invention are: U.S. Pat. No. 3,773,566, issued Nov. 20, 1973 to T. Tsuchimoto; U.S. Pat. No. 3,887,994, issued Jun. 10, 1975 to S. Ku, et al.; and U.S. Pat. No. 4,689,667, issued Aug. 25, 1987 to S. Aronowitz.

However, none of these technical papers or patents teaches or suggests to use such a noble gas implant to improve the isolation of a field oxidation layer from an active carrier implant of an integrated circuit.

SUMMARY OF THE INVENTION

In view of the deficiencies of the related art, it is an object for the present invention to provide a silicon-based integrated circuit having a noble gas implant layer improving the isolation of a field oxidation of the circuit from an active-carrier dopant implanted in the silicon prior to formation of the field oxidation.

An additional object for the present invention is to provide such an integrated circuit having bird's eye encroachment of the field oxidation layer under areas reserved for the formation of active circuit elements of the integrated circuit structure either eliminated or drastically reduced in comparison with conventional technology.

Still another objective for the present invention is to provide such an integrated circuit in which growth of defects of the crystalline silicon are eliminated and do not propagate into the underlying silicon and circuit structures.

Yet another object for the present invention is to provide a method of making such an integrated circuit.

Accordingly, the present invention provides an integrated circuit die comprising a substrate of single-crystal silicon upon which is formed a circuit morphology including silicon doped to form positive and negative charge carrier areas, the integrated circuit die including a field oxidation formed of oxidized amorphous silicon.

Additionally, the present invention provides a method of making an improved silicon semiconductor integrated circuit which is substantially free of encroachment of an insulative field oxidation layer of silicon oxide under active circuit elements of the integrated circuit, the method including the steps of: using shield elements to shield areas of the crystalline silicon substrate where the active circuit elements are to be formed, bombarding the crystalline silicon substrate of the integrated circuit with ions of a noble gas to create a layer of amorphous silicon which oxidizes at a rate greater than crystalline silicon, employing the shields to maintain foundations of crystalline silicon for the circuit elements, and oxidizing the amorphous silicon to form the field oxidation layer while leaving the crystalline silicon foundations for the active circuit elements substantially intact.

An advantage of the present invention resides in the maintenance of a desirably high voltage threshold for the field of the integrated circuit devices, and of a robust field isolation of the insulative silicon oxide layer.

Yet another advantage of the present invention resides in the improvement or shortening of manufacturing time and decreased manufacturing cost for an integrated circuit embodying the present invention because of the shortened manufacturing time required to form the field oxidation layer.

Still another advantage of the present invention resides in the improved yield of good integrated circuits from a manufacturing process incorporating the teaching of the present invention because of elimination of stress-induced defects in the silicon semiconductor material.

These and additional objects and advantages of the present invention will be apparent from a reading of the following detailed description of a single particularly preferred embodiment of the present invention, taken in conjunction with the appended drawing Figures, in which the same feature or features which are analogous in structure or function are indicated with the same reference numeral. the following

DETAILED DESCRIPTION OF THE DRAWINGS

Figure 1:
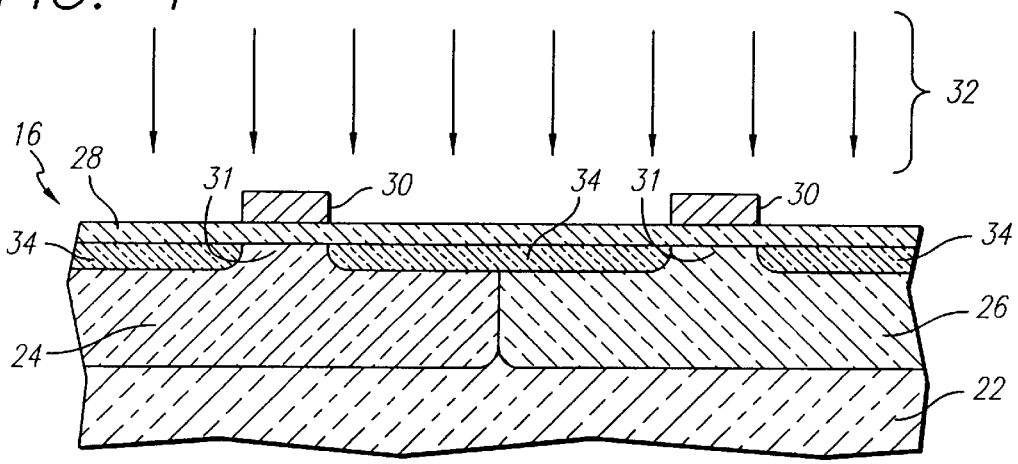
Figure 2:
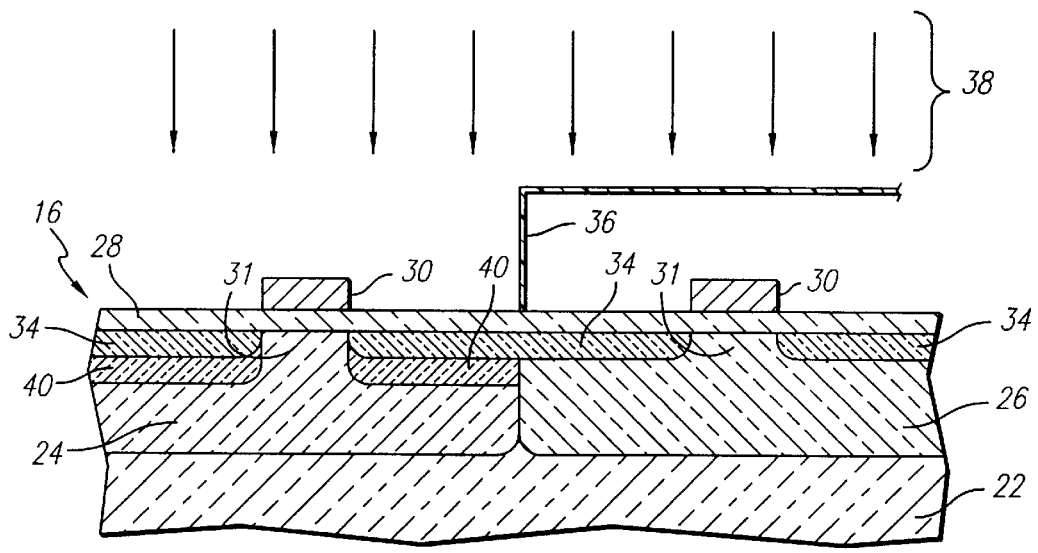
Figure 3:
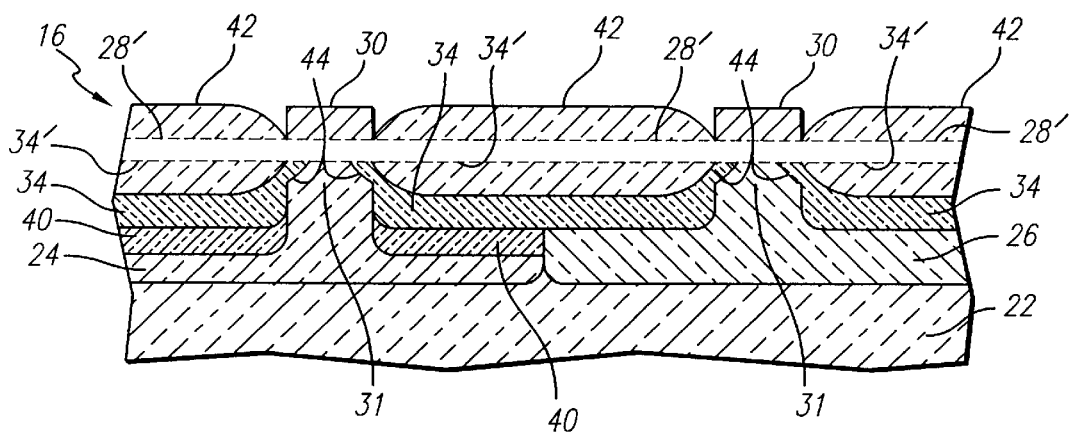

FIG. 1 provides a fragmentary showing a portion of only one of plural circuit dies on a processing wafer;

FIG. 2 provides a fragmentary cross sectional view like that of FIG. 1, and showing the circuit die at a later stage of manufacture; and FIG. 3 shows a fragmentary cross sectional view like FIGS. 1 and 2, and depicting the resulting structure at a still later stage of manufacture.

DETAILED DESCRIPTION OF THE EXEMPLARY PREFERRED EMBODIMENT OF THE INVENTION

Referring to the figures and, more particularly to FIG. 1 there is shown in fragmentary cross section a portion of one of the integrated circuit dies 16 at a particular stage of manufacture of an integrated circuit. At the depicted stage of manufacture, the single-crystal silicon material (referenced with the numeral 22) is doped with a dopant creating predominantly positive or negative charge carriers in the silicon material. Within and above a portion of the substrate, an N-well, a P-well or (both in the case of two-tub CMOS technologies) is created by doping the silicon with a dopant creating predominantly negative or positive charge carriers. For example, both a P-well 24 and N-well 26 may be formed. A layer of sacrificial silicon oxide 28 is then formed over both wells 24 and 26. In order to provide locations for the subsequent formation of active devices on the die 16, several shields 30 (only two of which are illustrated in FIGS. 1–3) of silicon nitride are formed over the sacrificial oxide layer 28. Those ordinarily skilled in the pertinent arts will recognize that the structures thus described are formed on and under the polished surface 14 of a semiconductor processing wafer, so that this surface is progressively replaced through successive processing steps with the physical elements of the circuit morphology necessary to define the completed circuits on the dies 16.

FIG. 1 also shows that at the particular stage of manufacture depicted, the processing wafer is subjected to an ion bombardment, as is represented by the arrows 32. The bombarding ions are noble gas atoms, and are energized to levels of about 50 to about 150 Kev. Preferably, Argon is used as the noble gas in the bombardment depicted in FIG. 1, and the Argon atoms are received into the silicon material 22 of the wafer at an implant dose of about $5 \times 10^{14}$ to about $5 \times 10^{15}$ atoms per square centimeter of surface of the die 16. At this energy and implant dose level, the Argon atoms penetrate into and through the sacrificial silicon oxide layer 28 and into the underlying silicon crystalline material of the wafer, to create an Argon implanted layer, which is referenced with the numeral 34.

The argon ion bombardment represented by arrows 32 damages or disrupts the regular crystalline lattice of the silicon material so that this material in layer 34 may be considered to be amorphous or "amorphized", rather than generally crystalline. Importantly, the noble gas atoms in the layer 34 do not go into substitutional sites in the crystalline silicon material, and consequently, are not easily mobile in the silicon material 22. It should be noted that the noble gas implant layer 34 is interrupted under the silicon nitride shields 30. That is, the shields 30 prevent the penetration of the noble gas ions through these shields and into the underlying silicon oxide and crystalline silicon material of the wafer. Consequently, under each shield 30, a foundation 31 of crystalline silicon is maintained upon which the active circuit elements may later be formed. Also, it should be noted that the silicon nitride shields 30 are tensile in nature, in comparison to a compressive stress found in the field area around these shields; that is, in comparison to the area around the shields 30 where the silicon oxide layer 28 is exposed.

Consequently, in later thermal cycling of the die 16, dislocation defects of the crystalline lattice can propagate from the stress concentrations adjacent to the shields 30, downwardly into the crystalline structure of the wafer. However, the ion bombardment (arrows 32) depicted in FIG. 1 effectively creates a surface layer (at 34) of amorphous material in which residual stresses are relieved. Consequently, the dislocation defects are eliminated and are no longer present to propagate into the crystal lattice of the silicon material. Further, the amorphous silicon material of layer 34 oxidizes more easily and at a higher rate under comparable conditions than does the crystalline silicon material 22. It follows, as will be further explained, that the growth of an insulative field oxidation layer on the wafer may be accomplished in a shorter time and at lower expense than would otherwise be possible. Still further, the regrowth of the crystalline lattice or re-crystallization of the amorphous silicon material layer 34, does not easily occur with the noble gas atoms present. Therefore, those thermal cycles of the wafer which are experienced during processing or manufacturing of the integrated circuit features on the wafer will not result in a loss of this improvement in oxidation rate of the field 34.

A mask may be placed over either the P-well or N-well, and over the one shield which also overlies this N or P-well. In FIG. 2 a mask 36 is shown by way of example over the N-well 26. Alternatively, however, mask 36 could have been placed over the P-well 24. As is well known in the art, the mask 36 may be a layer of photoresist. FIG. 2 also shows that at this stage of manufacture, the wafer is subjected to another ion bombardment, as is represented by the arrows 38. The bombarding ions are boron or germanium atoms if the N-well 26 is masked (so that the P-well 24 is formed), but could instead be phosphorous or arsenic atoms if the P-well 24 were masked (so that the N-well 26 is formed by the bombardment). During this ion bombardment the atoms penetrate into and through the layer 28, the noble gas implant layer 34, and into the crystalline material 22 of the wafer. That is, the bombarding atoms penetrate into the N or P-wells, and form an implant layer 40, which is in part coextensive with the field or layer 34 of argon atom implantation, and which extends below this argon field 34, as is indicated with the numeral 40. Again, the silicon nitride shield 30 prevents the bombarding atoms from penetrating into the material of the wafer immediately below the shield 30. The mask layer 36 also prevents these bombarding atoms from penetrating into the field in the area of the alternative N-well 26 or P-well 24, as further can be seen from viewing FIG. 2.

FIG. 3 shows that following the processing steps illustrated in FIG. 2, the mask layer 36 is removed, and a field oxidation layer 42 of silicon oxide is formed on the wafer 12. This field oxidation layer is formed, for example, by placing the wafer into a water steam environment at an elevated temperature of about 900 degrees F. The steam serves as an oxidant, providing oxygen into the structure of the wafer, and producing the layer 42 of silicon oxide, while consuming silicon from the wafer. This field oxidation layer 42 incorporates the sacrificial oxidation layer 28, and also consumes part of the amorphous silicon of the argon implanted field 34. For this reason, the line of demarkation between the field 34 as it was before the field oxidation step of FIG. 3, and the location of this argon implanted silicon as it is incorporated into the field oxidation layer 42 is shown in FIG. 3 with a dashed line 34'. Also, the previous location of the upper surface of the sacrificial oxide layer 28 is indicated with the dashed line 28'. Part of the argon implanted layer 34 remains between the field oxide layer 42 and the wells 24, 26, as is seen viewing FIG. 3.

It will be noted viewing FIG. 3, that the field oxidation layer 42 does not attach to or "wet" the silicon nitride shields 30. Consequently, at a subsequent step of manufacture, which is not shown in the drawing Figures, the shields 30 are removed. This removal of the shields 30 leaves areas for the formation of active circuit elements on the wafer, as was mentioned above. The left-hand one of the active circuit element areas communicates with the P-well 24, while the right-hand one of these active circuit element areas communicates with the N-well 26. Also, it should be noted that the implanted atoms of noble gas, which according to the depicted preferred embodiment are atoms of argon, in the field implanted area or layer 34 form a barrier which resist migration of the boron atoms from P-well 24 toward the oxidation layer 42 or outlying silicon regions during the manufacturing step depicted in FIG. 3. The argon atoms form triplex compounds with the silicon and boron which in part accounts for the stabilization of the implant layer 40. Consequently, after the field oxidation 42 is formed in the morphology depicted in FIG. 3, the layer 40 remains in place and lateral diffusion is reduced. This maintenance or stabilization of the implant layer is believed to enhance isolation of the field oxidation layer 42 from the implant layer 40, and maintenance of the desired high field threshold for the implant layer 40. By performing the noble gas implant, stresses on the field oxide are believed to be reduced, which in turn permits use of a thinner field oxide layer, and a reduction in the extent to which the field oxide layer squeezes underneath the nitride layer. This reduction in the incursion of the field oxide layer underneath the nitride layer effectively increases the area of active region formed underneath the nitride layer.

Further to the above, the amorphous silicon argon implant layer 34 is more easily and quickly oxidized than crystalline silicon. That is, the crystalline lattice of the silicon is disrupted or damaged by the bombarding atoms, as was discussed above. This amorphous silicon layer 34, along with the overlying ion-bombarded sacrificial oxide layer 28, which has been penetrated by the ions 32 as depicted in FIG. 2, and then penetrated again by the ions 38 as depicted in FIG. 3, is much easier to oxidize than would be the regular and unaltered silicon in its single-crystal matrix. The result is that the field oxidation step depicted in FIG. 3 is quicker and easier to complete than otherwise would be the case. During this field oxidation, any defects of the silicon which were present in the field oxidation area at or adjacent to the polished surface 14, are oxidized away. Consequently, these defects are no longer present to propagate into the crystalline lattice of the circuit chip 16' during subsequent heating and cooling cycles.

Still further, the noble gas implant layer 34 reduces encroachment of the field oxidation layer 42 under the shields 30. That is, the condition generally known in the art as "bird's beak", or the undermining of the N-well and P-well connections with the areas under shields 30 where active circuit elements are to be formed, is reduced by the comparatively faster oxidation of the amorphous silicon layer 34. A conventional bird's beak formation is schematically depicted with dashed line 44 under the left-hand one of the shields 30. However, as is seen at this shield, as well as at the right-hand shield 30, the present invention provides a morphological structure which is substantially without, or which in comparison with conventional integrated circuit structures has only a greatly reduced degree of encroachment of the field oxidation layer 42 under the active circuit element areas at shields 30. A further advantage of the present invention resides in the reduced level of active carrier implant dose immediately under the field oxidation layer 42. This reduced implant dose of active carriers improves the isolation of the field oxidation layer 42 with respect to the N-well 24, and P-well 26. Thus, the isolation of the field oxidation layer 42 is more robust than can be provided by conventional integrated circuit morphology.

While the present invention has been depicted, described, and is defined by reference to a particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

We claim:

1. An integrated circuit comprising:

a single-crystal silicon substrate;

said silicon substrate including a pair of adjacent wells of single-crystal silicon, one of said pair of adjacent wells being implanted with a P-type charge carrier dopant and the other of said pair of wells being implanted with an N-type charge carrier dopant;

one of said pair of wells including an anti-migration layer of single-crystal silicon over said one well, which anti-migration layer to inhibit migration is implanted with anti-migration atoms selected from the group consisting of: boron, germanium, phosphorous, and arsenic;

said pari of wells each also including an amorphized-silicon layer over said single-crystal silicon, which amorphized-silicon layer is formed of silicon of said substrate which is substantially amorphized by implantation of noble gas atoms, at said amorphized silicon layer over said one well silicon of said substrate further forming triplex compounds to inhibit lateral migration of said anti-migration layer; and said integrated circuit also including a field oxidation layer over said amorphized-silicon layer, said field oxidation layer including silicon of said amorphized silicon layer which is oxidized to form silicon oxide including noble gas atoms.

2. The integrated circuit of claim 1 wherein said noble gas atoms include atoms of argon.

3. The integrated cirucit of claim 2 wherein said noble gas atoms of argon are implanted into said silicon substrate at an implant dose of about $5 \times 10^{14}$ to about $5 \times 10^{15}$ argon atoms per square centimeter of surface area to amorphize silicon of said substrate.

4. The integrated circuit of claim 2 wherein said noble gas atoms of argon are implanted into said silicon as argon ions at an energy of about 50 to about 150 Kev, to amorphize said silicon.

5. The integrated circuit of claim 2 further including a silicon nitride shield overlying one of said pair of wells, said silicon nitride shield preventing both penetration into said single-crystal silicon which underlies silicon nitride shield of noble gas atoms, and the formation of amorphized silicon in said single-crystal silicon underlying said silicon nitride shield.

* * * * *